United States Patent [19]
Bristol

[11] Patent Number: 4,567,405
[45] Date of Patent: Jan. 28, 1986

[54] OSCILLOGRAPHIC DEVICE FOR DISPLAYING MULTIPLE CONTINUOUS WAVEFORMS

[75] Inventor: Lloyd R. Bristol, Tigard, Oreg.

[73] Assignee: Tektronix, Inc., Beaverton, Oreg.

[21] Appl. No.: 555,785

[22] Filed: Nov. 28, 1983

[51] Int. Cl.⁴ ............................................ G01R 13/28
[52] U.S. Cl. .................................. 315/392; 324/121 R
[58] Field of Search ............... 315/391, 392, 394, 395, 315/409, 410; 324/121 R

[56] References Cited
U.S. PATENT DOCUMENTS
3,032,679  5/1962  Roberts et al. ...................... 315/392
4,225,810  9/1980  Ushiro ................................. 315/392

Primary Examiner—Theodore M. Blum
Assistant Examiner—David C. Cain
Attorney, Agent, or Firm—John P. Dellett

[57] ABSTRACT

An oscillographic device receives plural vertical inputs which are multiplexed to provide plural traces by means of the same electron beam. Switching times of the multiplexer are varied during the display to avoid gaps in waveform presentation when the period of the device's horizontal sweep is a near multiple of the switching period of the multiplexer.

12 Claims, 3 Drawing Figures

OSCILLOGRAPHIC DEVICE FOR DISPLAYING MULTIPLE CONTINUOUS WAVEFORMS

BACKGROUND OF THE INVENTION

The present invention relates to an oscillographic device for displaying multiple input signals and particularly to such a device for avoiding apparent breaks in waveform presentation.

Multiple traces depicting multiple inputs may be displayed with a single beam oscilloscope by time sharing the oscilloscope's electron beam between different inputs. The sampling rate or switching rate between the different inputs is normally faster than the horizontal sweep rate of the oscilloscope such that only segments of the individual input signals are actually presented during a given sweep. However, the sweep rate is usually sufficiently high, and the switching rate and sweep rate sufficiently asynchronous, that gaps are not actually observed in the presentation but are "filled in" on successive traces.

Visible breaks in the display of multiple signals are more likely to appear to the viewer when the oscilloscope sweep period (normally a multiple of the input signal period) is also a near multiple of the display switching period. Thus, if the switching between input signals becomes "synchronized" with the oscilloscope's sweep period, then the breaks in the waveforms appear near the same location on each successive trace and are viewed in the same manner as an input signal would be viewed. The visible breaks are most likely to occur when crystal controlled signals are observed on an oscilloscope with crystal controlled display switching.

SUMMARY OF THE INVENTION

In accordance with the present invention in an illustrated embodiment thereof, the switching times of the switching means by which multiple input signals are multiplexed to the same vertical deflection means are automatically changed or varied to avoid gaps in the waveform presentation. In particular, the phase of the switching is progressively changed to avoid a condition where sampling of an input corresponds to the same portion the horizontal sweep during successive horizontal sweeps.

In a particular embodiment, multiplexing of input signals is accomplished at a first rate during a first mode of operation, after which the device executes a second mode of operation during which the phase of switching of the input signal is progressively advanced. Also in a particular embodiment, the two modes of operation alternate for successive periods, e.g. one millisecond periods.

It is accordingly an object of the present invention to provide an improved oscillographic device for supplying a multiple waveform presentation.

It is another object of the present invention to provide an improved oscillographic device for portraying multiple waveforms with a multiplexed electron beam wherein gaps in waveform presentation are avoided.

It is a further object of the present invention to provide an improved method of operating an oscillographic device for providing a display of multiple waveforms without gaps in the waveform presentation.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

FIG. 3 is a waveform chart illustrating operation of the FIG. 1 device.

DETAILED DESCRIPTION

Figure 1:
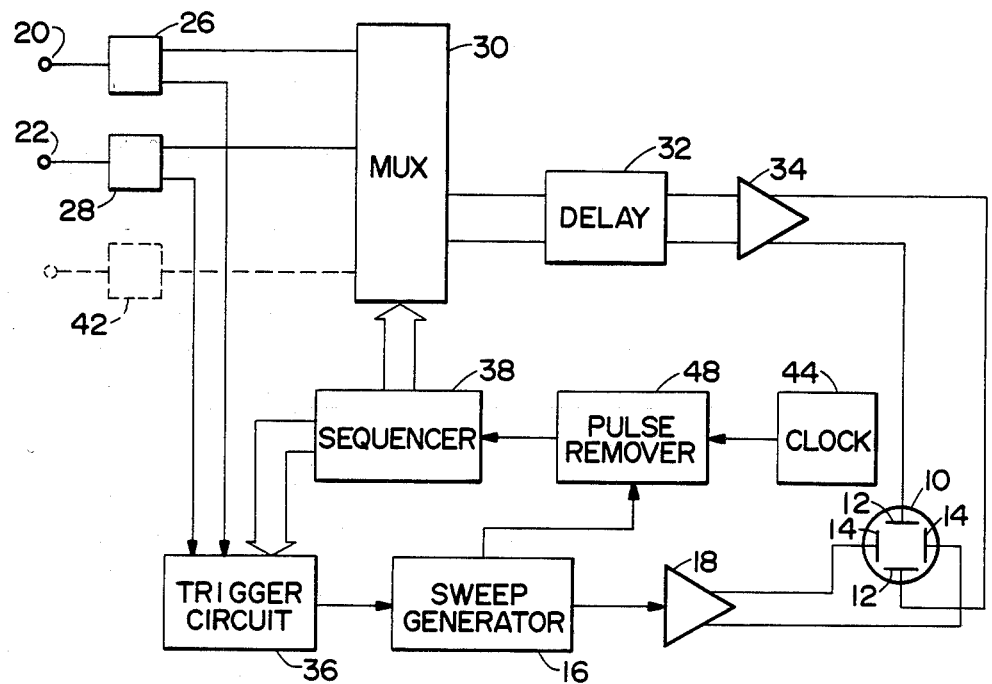
FIG. 1 is a block diagram of an oscillographic device in accordance with the present invention.

Referring to the drawings and particularly FIG. 1, an oscilloscope device according to the present invention includes a cathode ray tube 10 having electron beam generating means (not shown), a first set of vertical deflection plates 12 and second set of horizontal deflection plates 14. A horizontal sweep signal or ramp is conventionally provided from a sweep generator 16 and amplified by horizontal amplifier 18 for application to the horizontal deflection plates 14 during the the time the vertical deflection signal is applied to vertical deflection plates 12 in order to portray the waveform of the input signal relative to a time base.

In the present device, plural input signals are received at terminals 20 and 22 and coupled via vertical preamplifiers 26 and 28 to vertical multiplexer 30 which selects between the vertical input signals and supplies a selected output to delay means 32. Delay means 32 delays the selected input signal sufficiently to insure the initiation of a time base sweep before supplying its output to vertical deflection plates 12 via vertical amplifier 34. A trigger circuit 36 also receives input signals from preamplifiers 26 and 28 (and may as well receive an external trigger and a line trigger input) for determining the event which is to initiate operation of sweep generator 16.

Vertical multiplexer 30 and trigger circuit 36 are under the control of display sequencer 38 which may comprise a switch for selecting between the input signals applied at terminals 20 and 22. In accordance with the present device, sequencer 38 switches automatically and sequentially between the vertical inputs 20 and 22 at a rate sufficiently rapid to provide the effect of substantially simultaneous display of the respective input waveforms. In the case of two input signals as illustrated, sequencer 38 may comprise a simple multivibrator, but in the event further inputs are supplied, e.g. at an input terminal via preamplifier 42, sequencer 38 may comprise a multistate circuit with more than two states as understood by those skilled in the art.

In the circuit according to the present invention, sequencer 38 receives clock pulses from clock pulse source 44 and performs a counting function such that the sequencer switches multiplexer 30 when a predetermined number of clock pulses have been counted. Thus, for example, the sequencer may switch multiplexer 30 after each sequence of five clock pulses from source 44 so that after every fifth clock pulse, a different one of the two input signals is applied to the vertical deflection plates 12.

As hereinbefore indicated, difficulties in the multiplexed presentation can arise when the sweep period, i.e. the period of sweep generator 16, is a near multiple of the display switching period, i.e. the period of sequencer 38. As will be understood, the sweep period is usually also a mltiple of the input signal period.

In accordance with the present invention, the device is further sequenced between a first or normal mode of operation during which sequencer 38 counts clock pulses from clock source 44 and switches after every predetermined number of clock pulses, and a second mode of operation during which clock pulses are periodically removed from the sequence by pulse remover 48. In particular, pulse remover 48 receives an input signal from sweep generator 16 and removes one pulse from the chain of pulses counted by sequencer 38 during each sweep that occurs during the second mode. As hereinafter more fully explained, the switching phase as well as the frequency of sequencer 38 therefore change during such second mode of operation for successive sweeps, and consequently unwanted gaps in the waveform presentation are eliminated.

Figure 2:
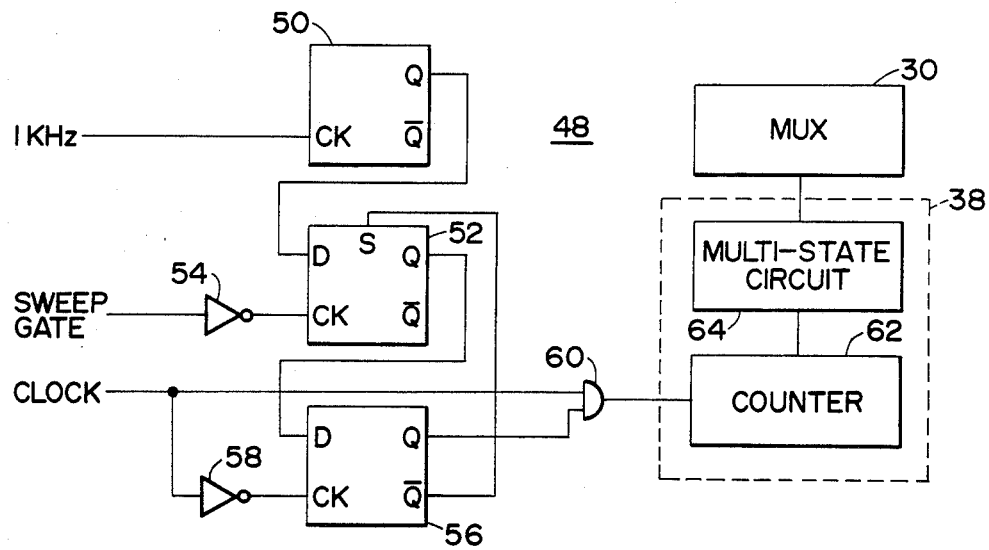
FIG. 2 is a block diagram of a pulse remover circuit according to the device of the present invention.
Figure 2:
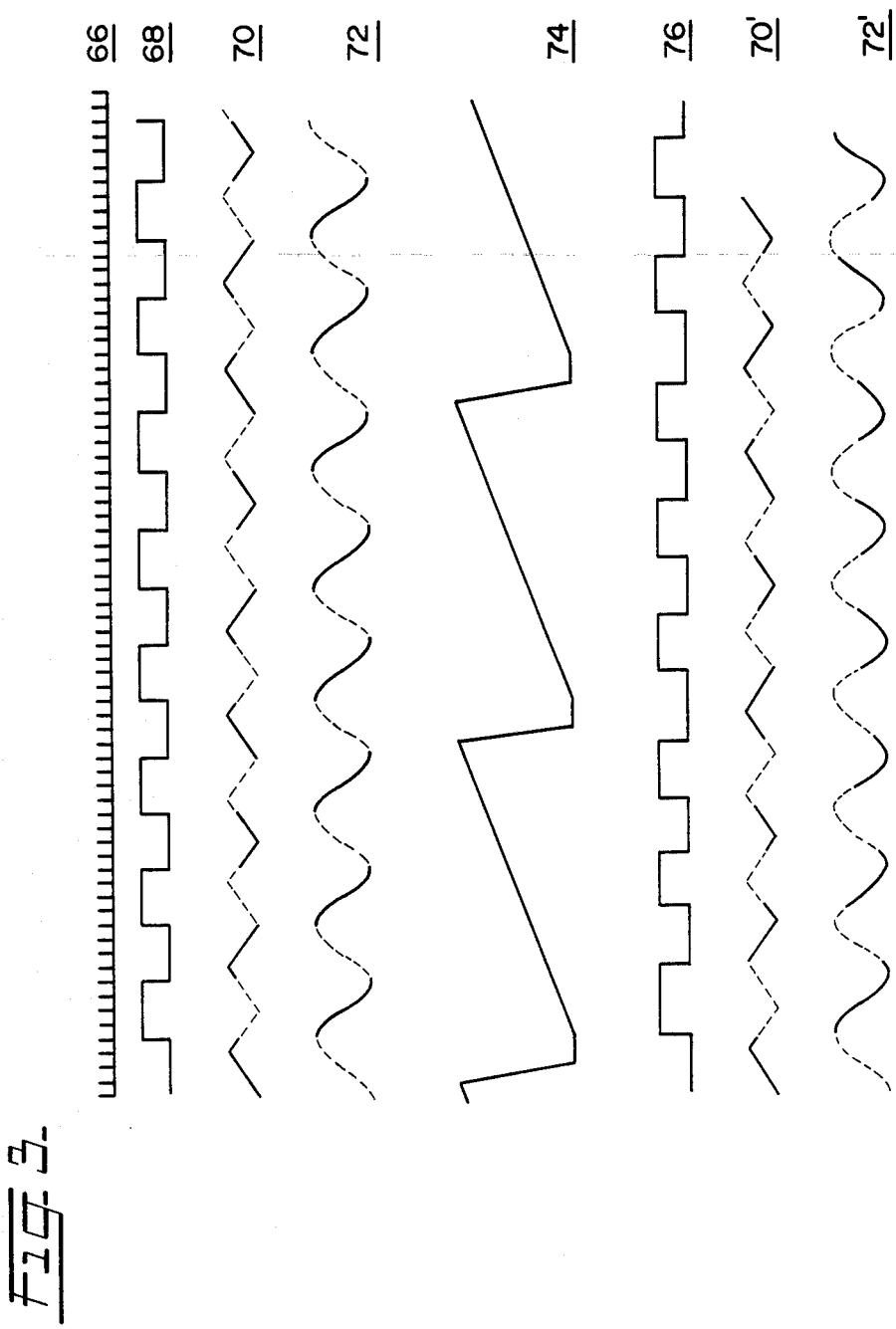

Referring to FIG. 2, the pulse remover 48 is disclosed in greater detail. A toggle flip-flop 50 receives a relatively low speed clocking input, for example at a one kilohertz rate, causing the flip-flop alternately to provide a high output at its Q and $\overline{Q}$ terminals. The Q output of flip-flop 50 is connected to the D input of D flip-flop 52 which also receives a sweep gate input from sweep generator 16 in FIG. 1 via inverter 54 on its clock input terminal. The Q output of flip-flop 52 drives the D input of D flip-flop 56, the latter having a clock input terminal receiving the clock pulse sequence from clock pulse generator 44 in FIG. 1 by way of inverter 58. The $\overline{Q}$ output of flip-flop 56 is connected to the set input of flip-flop 52, and the Q output of flip-flop 56 provides one input to AND gate 60 also receiving the clock sequence from clock pulse generator 44 in FIG. 1. The output of AND gate 60 drives counter 62 which in turn operates multi-state circuit 64 when the counter reaches a predetermined value. The counter 62 and multi-state circuit 64 function as the sequencer 38 in FIG. 1 and drive vertical multiplexer 30.

As long as the Q output of flip-flop 50 is true, the Q output of flip-flop 52 also remains true which in turn causes the Q output of flip-flop 56 to remain true, thereby enabling AND gate 60. AND gate 60 couples clock pulses to counter 62 which counts out on some predetermined number of pulses, say four pulses, at which time multi-state circuit 64 is triggered to its next state. In the simplest case, multi-state circuit 64 comprises a two state flip-flop and each time counter 62 counts out, multi-state circuit 64 changes to its opposite state thereby alternately enabling either input 20 or input 22 in FIG. 1. For the status of the pulse remover 48 just described, the "normal" mode of operation for the FIG. 1 circuit is achieved and the signal to the vertical plates 12 of the cathode ray tube is switched for each predetermined number of pulses from the clock pulse source 44.

The one kilohertz input to toggle flip-flop 50 alternately changes the toggle to a second state providing a second mode of operation for removing pulses from the pulse stream coupled to counter 62. Upon alternate occurrence of the one kilohertz clocking input of flip-flop 50, the Q output thereof becomes false, and at the occurrence of the sweep gate (at the time of the next generated sweep) inverted by inverter 54, the output of flip-flop 52 also becomes false. In turn, the Q output of flip-flop 56 becomes false at the next occurrence of a clock pulse applied to flip-flop 56 via inverter 58. When the Q output of flip-flop 56 becomes false, AND gate 60 is no longer enabled and counter 62 receives one less clock input to count.

The $\overline{Q}$ output of flip-flop 56, however, sets flip-flop 52 such that the Q output of flip-flop 52 now becomes true. Consequently, at the end of the next clock pulse, flip-flop 56 again provides a Q output to AND gate 60 and clock pulses are once more passed through the AND gate to counter 62. This condition is maintained for the remainder of the sweep, and simply results in multi-state circuit 64 being triggered to its next state one clock pulse later than would have otherwise been the case.

Assuming the Q output of toggle flip-flop 50 remains false, the sequence is repeated at the next sweep gate applied via inverter 54 to flip-flop 52, and one more clock pulse is subtracted from the train of clock pulses supplied to counter 62. Consequently, the switching times of multiplexer 30 are successively delayed during each sweep period so long as toggle flip-flop 50 remains in the state with the Q output false. In fact, the mode of operation may continue for several sweeps until the next one kilohertz input to toggle flip-flop 50 produces a Q true condition.

It has thus seen the circuit shifts between a first mode of operation in which every clock pulse is counted by counter 62, and a second mode of operation in which one clock pulse is missed for every sweep.

The overall operation of the circuit is better understood by reference to waveform chart of FIG. 3 wherein clock pulses from clock pulse generator 44 are illustrated at 66. The first mode of operation during which every clock pulse is counted and the multiplexer is switched at the conclusion of every predetermined number of clock pulses is illustrated in the top part of the diagram (the top four waveforms). In this particular instance, it is assumed that the multi-state circuit 64 comprises a bistable flip-flop having a waveform output indicated at 68, the flip-flop changing states at the occurrence of each fourth clock pulse 66. For purposes of illustration, two input waveforms 70 and 72 are assumed to be applied to the input terminals 20 and 22 in FIG. 1, the first input constituting a triangular wave and the second input constituting a sine wave. The sweep waveform of the oscilloscope is illustrated at 74. In this particular instance, the period of sweep waveform is seen to be a multiple of the period of input signal 72, i.e. the sweep period is almost exactly three times the vertical signal period, such that breaks in the waveform displays appear to be either stationary or moving through the display.

For purposes of illustration it is assumed that the multiplexer 30 provides input signal 72 to the vertical deflections plates during the positive half-cycles of sequencer waveform 68, and provides the input 70 to the vertical deflection plates during the negative half-cycles of sequencer waveform 68. The portions of waveforms 72 and 70 that are then visible on the oscilloscope traces are shown darkened, while the portions of the input signal traces are not appearing shown in dashed line. Since the sequencer waveform is in phase with the input signal and sweep, it will be seen that only the second half of the sine wave 72 is repeatedly depicted upon the screen of the cathode ray tube with the breaks occurring therebetween as illustrated by the dashed lines. (The dashed lines will not appear on the oscilloscope traces at all, but are only employed in the drawing to illustrate the portions which are completely absent.)

The second half of the drawing (lower three waveforms) is illustrative of a second mode of operation according to the present invention where one clock pulse is inhibited from reaching the counter of the sequencer during each sweep of the oscilloscope. As can be seen from the waveform 76, representing the output of the multi-state circuit 64, the next transition after the start of each sweep is delayed by one clock pulse. Thus, the transitions of waveform 76 are shifted in phase to the right by one clock pulse at each occurrence of sweep waveform 74. It is assumed the inputs 70' and 72' are input signals applied at input terminals 20 and 22 in FIG. 1, and that the positive going half cycles of sequencer output 76 enable the input waveform 72'. It will be seen that since the waveform 76 progressively changes in phase, that progressively different segments of the waveform 72' will be seen on the screen (corresponding to the darker portions of the waveform 72'). With the rapid repetition of the display, each of the waveforms 70' and 72' will appear to be substantially continuous and without breaks. Thus, even though one of the waveforms initially has a multiple relationship or a near multiple relationship with the sweep, the break in the visible waveform presentation is prevented because of variation in switching times with respect to the input signal.

It will be noted that the switching times are not only shifted in phase, but the frequency of switching is decreased slightly inasmuch as switching takes place less frequently as counted pulses are eliminated.

While the illustrated embodiment operates by removing a counted pulse each time the sweep occurs, it is also possible to add one pulse each time a sweep occurs and thus cause a phase shift and a frequency shift in sampling in the reverse direction. Moreover, although it is convenient for shifting of the switching phase to occur once for each sweep of the sweep generator, it is also possible for the shift in the switching phase to occur asynchronously with respect to the sweep rate.

While I have shown and described a preferred embodiment of my invention, it will be apparent to those skilled in the art that many other changes and modifications may be made without departing from my invention in its broader aspects. I therefore intend the appended claims to cover all such changes and modifications as fall within the true spirit and scope of my invention.

I claim:

1. An oscillographic device for providing a display of repetitive waveform phenomena, said device comprising:
    first beam deflection means for deflecting an electron beam in a first sense to portray amplitude input signal information and orthogonal deflection means for concurrently deflecting said beam in a second sense for representing time,
    time base means for providing a sweep signal to said orthogonal deflection means,
    and switching means for receiving plural input signals and consecutively and repetitively employing said plural input signals for operating said first deflection means, said switching means having a switching rate sufficiently rapid to provide the effect of substantially simultaneous display of the plural input waveforms,
    including means for automatically varying switching times of said switching means during display of said waveforms to avoid gaps in waveform presentation when the period of said sweep signal is near a multiple of the switching period of said switching means.

2. The device according to claim 1 wherein said means for automatically varying the switching times of said switching means comprises means for switching said switching means at a first rate during a first mode of operation, and for progressively changing the switching time of said switching means during a second mode of operation.

3. The device according to claim 2 wherein said switching means comprises a source of pulses and a pulse counting sequencer responsive to a predetermined number of pulses to initiate switching,
    and means for varying the number of pulses provided to said sequencer during said second mode of operation.

4. The device according to claim 3 wherein said means for varying the number of pulses is responsive to the operation of the time base sweep of said oscillographic device for deleting at least one pulse from delivery to said sequencer for each successive sweep during said second mode of operation.

5. The device according to claim 4 including means for toggling between said first mode of operation and said second mode of operation.

6. The device according to claim 1 wherein said means for automatically varying said switching times changes the rate of switching.

7. The device according to claim 1 wherein said means for varying said switching times changes the phase of said switching.

8. An oscillographic device for providing a display of repetitive waveform phenomena, said device comprising:
    first beam deflection means for deflecting an electron beam in a first sense to portray amplitude input signal information and orthogonal deflection means for concurrently deflecting said beam in a second sense for representing time,
    time base means for providing a sweep signal to said orthogonal deflection means,
    switching means for receiving plural input signals and consecutively and repetitively employing said plural input signals for operating said first deflection means,
    a source of clock pulses, said switching means receiving said clock pulses and being responsive to a predetermined number of clock pulses for switching between input signals,
    pulse removing means interposed between said source of clock pulses and said switching means for removing at least one clock pulse,
    and toggling means for operating said pulse removing means to remove at least one clock pulse during selected time intervals.

9. The device according to claim 8 wherein said pulse removing means is further responsive to said time base means for removing at least one clock pulse for successive time base sweeps during selected time intervals.

10. The method of operating an oscillographic device having vertical and horizontal deflection means, said method comprising the steps of:
    applying a time base sweep waveform to said horizontal deflection means,
    selectively and repetitively applying plural input signals to said vertical deflection means including switching between said plural input signals at a sufficiently rapid rate to provide the effect of substantially simultaneous display of plural input waveforms, and automatically varying switching times to avoid gaps in waveform presentation when repeated input samples tend to occur in time relation to a given portion of the time base sweep.

11. The method according to claim 10 wherein automatically varying switching times includes progressively changing the phase of said switching relative to the time base sweep.

12. The method according to claim 11 including a first mode of operation, and a second mode of operation periodically replacing said first mode of operation, wherein the phase of said switching is progressively changed in said second mode of operation as compared with said first mode of operation.

* * * * *